United States Patent
Ebeling et al.

(10) Patent No.: US 6,990,127 B2
(45) Date of Patent: Jan. 24, 2006

(54) VERTICAL LASER DIODE WITH MEANS FOR BEAM PROFILE FORMING

(75) Inventors: Karl Joachim Ebeling, München (DE); Thomas Knödl, Ulm (DE)

(73) Assignee: Infineon Technologies AG, Munich (DE)

( * ) Notice: Subject to any disclaimer, the term of this patent is extended or adjusted under 35 U.S.C. 154(b) by 251 days.

(21) Appl. No.: 10/047,613

(22) Filed: Jan. 15, 2002

(65) Prior Publication Data
US 2002/0118720 A1  Aug. 29, 2002

(30) Foreign Application Priority Data
Jan. 15, 2001 (DE) ................ 101 02 458

(51) Int. Cl.
H01S 3/113 (2006.01)
H01S 3/098 (2006.01)
H01S 5/00 (2006.01)
(52) U.S. Cl. ............... 372/11; 372/18; 372/50
(58) Field of Classification Search ........... 372/96, 372/50, 46, 43, 18, 19, 11
See application file for complete search history.

(56) References Cited

U.S. PATENT DOCUMENTS

| | | | | |
|---|---|---|---|---|
| 5,056,098 A | * | 10/1991 | Anthony et al. | 372/45 |
| 5,426,657 A | * | 6/1995 | Vakhshoori | 372/45 |
| 5,574,738 A | | 11/1996 | Morgan | 372/45 |
| 6,026,108 A | | 2/2000 | Lim et al. | 372/50 |

FOREIGN PATENT DOCUMENTS

| | | |
|---|---|---|
| DE | 196 46 015 A1 | 6/1997 |
| DE | 199 08 426 A1 | 9/2000 |

* cited by examiner

*Primary Examiner*—Minsun Oh Harvey
*Assistant Examiner*—Armando Rodriguez
(74) *Attorney, Agent, or Firm*—Laurence A. Greenberg; Werner H. Stemer; Ralph E. Locher

(57) ABSTRACT

A vertical laser diode includes a vertical resonator and a device for shaping the beam profile of the laser diode. The shaping device has at least one decoloring absorber. The configuration provide a vertical laser diode structure that permits stable beam profile shaping.

22 Claims, 2 Drawing Sheets

VERTICAL LASER DIODE WITH MEANS FOR BEAM PROFILE FORMING

BACKGROUND OF THE INVENTION

Field of the Invention

The invention relates to a laser diode with a vertical resonator having a shaper for shaping the beam profile of the laser diode with at least one bleaching absorber in a vertical resonator and to an optical system, in particular a CD player or a data transmission system, with such a laser diode Vertical laser diodes are known, for example, in the material systems of InAlGaAsN or InAlGaP on a GaAs substrate, InAlGaAsP on an InP substrate or InAlGaAsN on a sapphire or SiC substrate and are described in their essential features in K. J. Ebeling, Integrated Optoelectronics, Springer Verlag 1993.

It is characteristic of these vertical laser diodes that the vertical laser diodes contain active multiquantum well layers for light generation and Bragg reflectors integrated in a monolithic or hybrid manner, which form the optical Fabry-Perot resonator. For current constriction in the vertical laser diode, selective lateral oxidation, proton implantation or mesa etching are used, which along with thermal effects also determine the optical wave guidance in the structures.

In the case of the known vertical laser diodes, it is disadvantageous that the structure-induced transverse mode selection is not particularly efficient, so that pure emission on the transverse fundamental mode can be observed only in structures with small diameters and at comparatively low output power levels.

SUMMARY OF THE INVENTION

The object of the present invention is to specify a vertical laser diode structure which permits stable beam profile shaping.

This object is achieved according to the invention by a laser diode with a vertical resonator having a shaper for shaping the beam profile of the laser diode with at least one bleaching absorber in a vertical resonator.

An important part of the invention is the introduction of a means for beam profiling, the means having at least one absorber means with a bleaching by decoloring (saturable) absorber.

The at least one bleaching absorber means favors emission of the dominant transverse mode with highest optical intensity (for example transverse fundamental Gaussian mode with its intensity maximum on the axis), since the bleaching of the absorber is at its greatest at the locations of greatest intensity.

Bleaching absorbers or bleaching quantum films are known per se as optical absorbers with nonlinear absorption behavior. The transmission of the bleaching absorbers depends on the irradiated radiation intensity. With increasing power densities, the absorption decreases; at very high power densities, the absorber is substantially transparent. The use of absorber means for semiconductor lasers is known in principle (for example from U.S. Pat. No. 5,574, 738), these absorber means only being used to absorb certain wavelengths of the radiation, to achieve self-modulation of the laser diode in the GHz range.

The invention is concerned with the fact that light in the vertical resonator has in principle an inhomogeneous intensity distribution over the beam cross section, the bleaching absorber means ensuring that the light is attenuated only little at the locations of high intensity in the absorber means.

Consequently, absorption losses of the dominant transverse mode (for example transverse fundamental Gaussian mode) in laser diodes with a vertical resonator can be kept particularly small, so that the emission on this transverse mode (for example the fundamental mode) is favored. Consequently, beam profiling is achieved in an efficient way.

With suitable setting of the fundamental absorption for low light power levels and the current-dependent optical amplifiers in the laser, self-pulsations and also optical and electrical bistability can occur.

This form of operation is preferred in optical scanning systems, for example in a CD player. In addition, the local charge carrier generation by absorption in the bleaching absorber means has the effect of promoting the current injection near the axis of the active zone, which in turn is advantageous for the fundamental mode emission.

Use of the laser diode according to the invention also allows the dynamic performance of the switching on and switching-off operation of optical data transmission devices to be improved. In these operations, the build-up of oscillations of other, in particular higher, transverse modes occurs. Use of a bleaching absorber means in the laser diode stabilizes the emission on the dominant transverse mode (for example transverse fundamental mode) and consequently prevents the undesired occurrence of pattern effects in the transmission of digital signal sequences. As a result, higher data transmission rates and a more stable mode behavior can be achieved over a wide temperature range. Furthermore, fundamental mode operation is consequently possible with larger component dimensions, so that the required production tolerances are reduced.

In advantageous configuration of the present invention, a pn junction of III-V or II-VI compound semi conductor material is used, since these materials are well suited for vertical laser diodes.

To make production simple, at least one absorber means is integrated monolithically into a series of layers.

For particularly efficient beam profiling, it is advantageous if at least one absorber means is arranged in the Fabry-Perot resonator of the series of layers of the vertical laser diode. The absorber and amplifier quantum films then advantageously lie in the beam waist of the Gaussian beam and ensure an optimum transverse mode selection.

Furthermore, it is advantageous if at least one absorber means is arranged outside the depletion zone of the pn junction.

In a further advantageous configuration of the laser diode according to the invention, at least one bleaching absorber means is formed as a layer in the vertical resonator, the thickness of the layer being small, approaching a quarter of the material wavelength. It is also advantageous if at least one absorber means is formed as a layer with the thickness of the layer being greater than a quarter of the material wavelength. Selection of the layer thickness of one or more layers allows the absorption behavior to be varied.

It is advantageous if at least one absorber means has a means of current constriction, in particular by combination of the medium of the absorber means with an oxide aperture or a proton implantation. The transverse mode selection can be assisted in this way.

It is likewise advantageous if the laser diode according to the invention has two electrical supply leads, one for the p contact and one for the n contact.

In an advantageous way, an embodiment of the laser diode has a current constricting means in the vertical resonator.

A further improvement of the mode selection can be achieved if, in an advantageous way, at least one reflective layer in the vertical resonator has a relief structure, in particular a Fresnel lens.

At least one spacer layer is arranged with advantage in the vertical resonator, in particular between the absorber layer and the active zone.

Furthermore, it is advantageous for influencing the emission wavelengths if at least one layer of the vertical resonator consists of GaAsN or InGaSbP.

The laser diode according to the invention is advantageously used in optical systems, in particular in CD players and data transmission systems.

Other features that are considered as characteristic for the invention are set forth in the appended claims.

Although the invention is illustrated and described herein as embodied in a vertical laser diode with beam profile shaping, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENT

Figure 1:
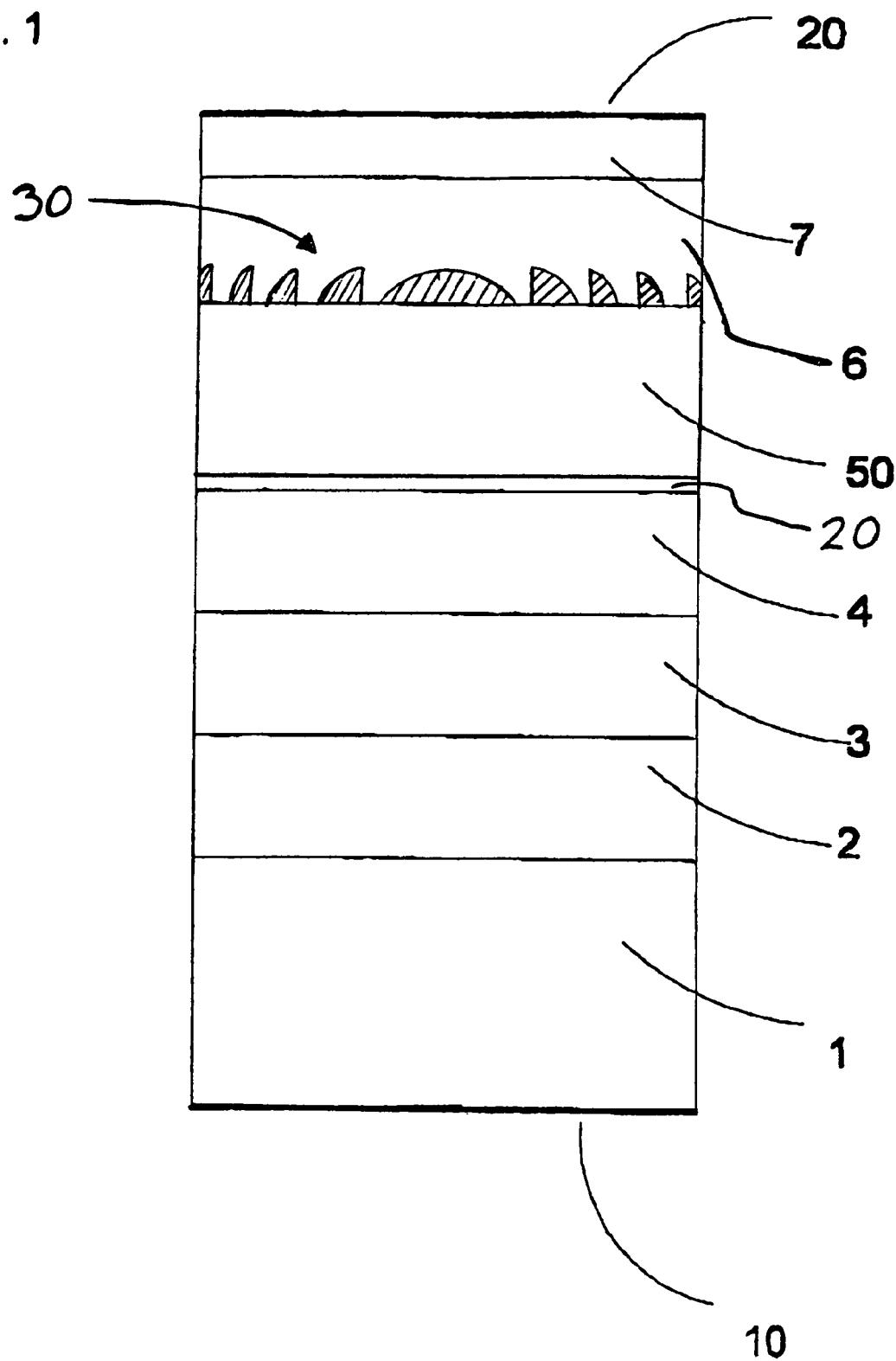
FIG. 1 is a schematic representation of an embodiment of the vertical laser diode according to the invention.

Referring now to the figures of the drawings in detail and first, particularly to FIG. 1 thereof, there is shown a vertical laser diode with an integrated absorber layer 50 with bleaching absorber means 5. The vertical laser diode having, as the lowermost layer, an n-doped GaAs substrate 1, which is provided with a GeNiAu contact 10.

The structure outlined in FIG. 1 of a vertical laser diode with an integrated bleaching absorber layer 50 with an absorber means 5 has, as the lowermost layer, an n-doped GaAs substrate 1, which is provided with a GeNiAu contact 10.

An approximately 4 µm thick, first $Al_{0.7}GaAs_{0.3}$—GaAs Bragg reflector 2, with a doping of $n=1*10^{16}$ cm$^3$, is grown onto the GaS substrate.

Arranged above the Bragg reflector 2 is an n-doped ($n=5*10^{17}$ cm$^3$) $Al_{0.3}Ga_{0.7}As$ carrier capture layer 3 and arranged over that is an undoped active zone 4. The active zone 4 has three 8 nm thick quantum films 4a with approximately 50 nm thick GaAs boundary layers 4c and 10 nm thick GaAs barriers 4b (see in detail of FIG. 2).

Figure 2:
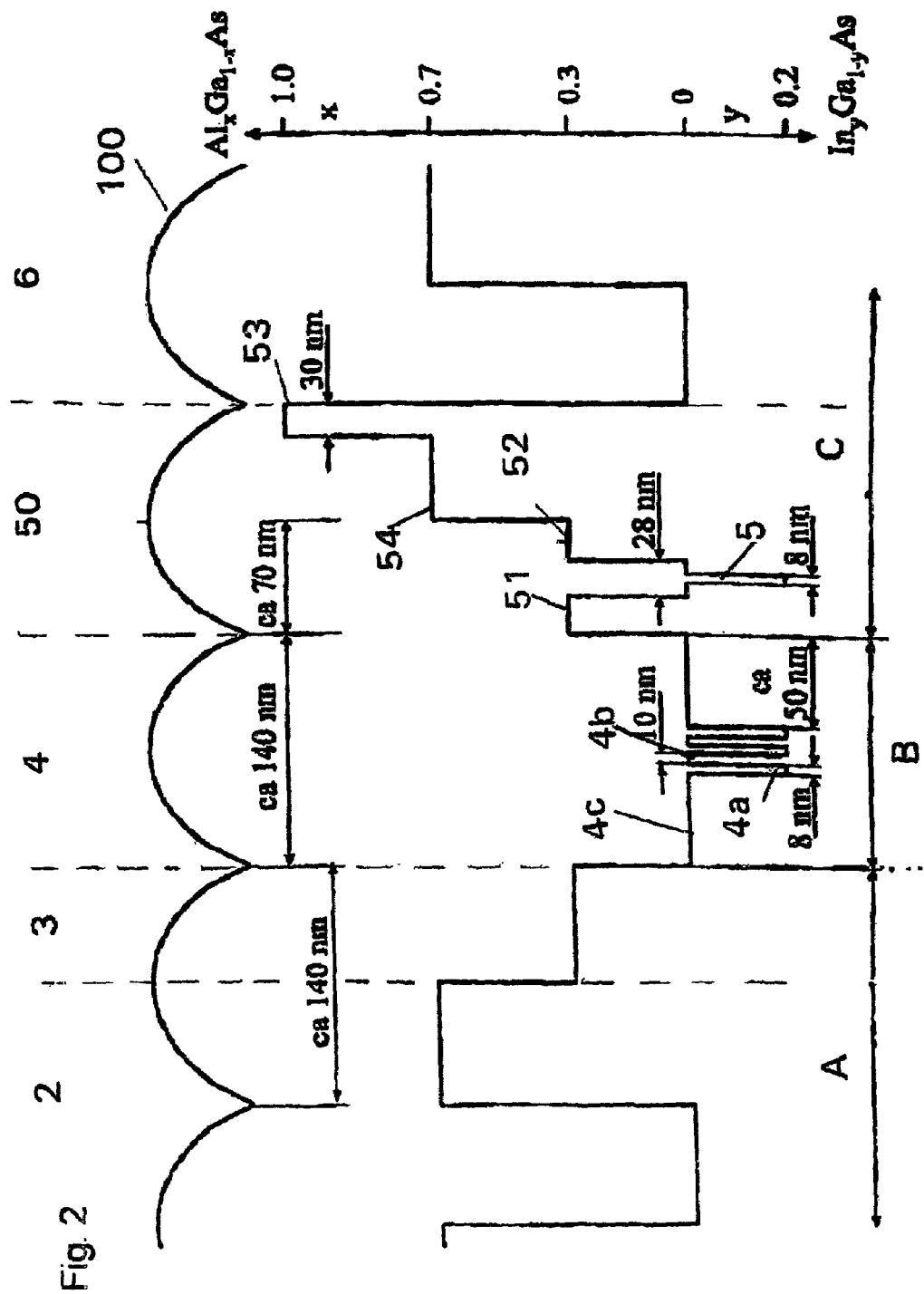
FIG. 2 is a detail of the vertical laser diode according to FIG. 1.

Located above the active zone 4 is an $Al_{0.3}Ga_{0.7}As$ carrier capture layer 51, not represented here in detail, which has a doping of $p=5*10^{17}$ cm$^3$ (see FIG. 2). This carrier capture layer 51 is assigned here to the identically doped absorber layer 50 (FIG. 2).

Arranged in the absorber layer 50 as the bleaching absorber means 5 is an 8 nm thick In0.2Ga0.8As quantum film. This is surrounded on both sides by in each case 10 nm thick GaAs barriers, these layers all having a doping of $p=5*10^{17}$ cm$^3$ (see FIG. 2).

Serving as the bleaching absorber means 5 as such is the $In_{0.2}Ga_{0.8}As$ quantum film. The transparency of the absorber means 5 increases with increasing irradiation intensity, so that at high intensities the absorber means is substantially transparent. In the case of such quantum films, the intensity critical for the bleaching by decoloring lies around 1 kW/cm$^2$.

The absorber layer 50 may be arranged in the p-doped or n-doped region of the cladding layer. If a plurality of absorber layers 50 are used, they can be arranged in both regions of the cladding layer.

The strength of the desired absorption can be specifically set by the material composition and the thickness and position of the absorber layer(s) 50 in relation to the nodes and antinodes of the standing wave field 100 (see FIG. 2).

Arranged on the absorber layer 50 is an approximately 4 µm thick second $Al_{0.7}Ga_{0.3}As$—GaAs Bragg reflector 6, doped with $p=1*10^{18}$ cm$^3$.

This is finished off by a 10 nm thick $p^{++}$ doped GaAs contact layer 7, to ensure a low-impedance connection to the p contacts by means of a TiPtAu contact 20.

FIG. 2 shows the structure of the stack of layers between the two Bragg reflectors 2, 6 according to FIG. 1 as a detail.

The compositions of the layers is reproduced by the scale on the right-hand edge of FIG. 2. The variables x and y specify here the composition of the respective compound semiconductor $Al_xGa_{1-x}As$ or $In_yGa_{1-y}As$.

At the upper edge of FIG. 2, the assignments of the layers to FIG. 1 are specified, the layers being indicated by vertical broken lines. The thickness of the layers is specified by dimensions. Furthermore, the optical standing wave field 100 that forms is represented. The thicknesses of the layers are adapted to the standing wave field.

At the lower edge of FIG. 2, the dopings of the layers are specified. The region A is n-doped, the region B is undoped, the region C is p-doped.

Arranged on the left-hand side of the series of layers is the first Bragg reflector 2, arranged on right-hand side is the second Bragg reflector 6.

In the middle of the series of layers lies the active zone 4, which has three $In_{0.8}Ga_{0.2}As$ quantum films 4a, which are in each case 4 nm wide. The active zone 4 also has 10 nm thick GaAs barriers 4b and on both sides approximately 50 nm thick GaAs boundary layers 4c.

Arranged between the absorber means 5 and the active zone 4 is the $Al_{0.3}Ga_{0.7}As$ carrier capture layer 51, which has a doping of $p=5*10^{17}$ cm$^3$.

The absorber means 5 has an 8 nm thick $In_{0.2}Ga_{0.8}As$ quantum film 5 with 10 nm thick GaAs barriers on both sides, which altogether have a doping of $p=5*10^{17}$ cm$^3$. In an alternative configuration, the bleaching absorber means 5 may be undoped.

The relative position of the bleaching absorber means 5 in the standing wave field 100 determines the critical average intensity which is necessary for reaching the transparent state.

The $A_{l0.3}Ga_{0.7}As$ cladding layer 52 lying over the upper GaAs barrier is p-doped to the same degree as the carrier capture layer 51.

Arranged adjoining to the right in FIG. 2 is a layer 54 for increasing the reflectivity of the Bragg reflector.

There follows an approximately 30 nm thick p-doped AlAs layer 53, which after selective oxidation serves for the lateral current constriction in the component.

The active quantum films for light emission are located in an antinode of the optical standing wave field 100 in a depletion zone of the pn junction.

The structure described can be produced in a known way, for example using proton implantation or selective oxidation, as a vertical laser diode. The series of layers described can be realized, for example, by molecular beam epitaxy. Carbon may be used, for example, for the the p doping, Si for the n doping. Production is also possible with metal organic vapor phase epitaxy.

The saturable absorber layer according to the invention is particularly well suited for monolithic integration and is thereby advantageous for high optical output power in the transverse fundamental mode. The structure also allows the self-pulsating operation of vertical laser diodes. The carrier lifetime in the saturable absorber, which can be set by the doping or crystalline morphology or composition of the latter, allows the saturation intensity of the absorber to be set and also the characteristic period of the self-oscillation to be regulated.

Alternative forms of construction than the configuration outlined, with a plurality of thin bleaching absorber layers or solid saturable structures, are of course possible. Similarly, the structure is not restricted to the InAlGaAs semiconductor system, but can also be realized for example in the material systems of InGaAsP (for example on an InP substrate) or InAlGaAsN (for example on a sapphire, SiC or GaAs substrate). The vertical laser structure can also be realized in II-VI semiconductor systems, such as ZnMgBe$$e for example.

Depending on the emission wavelength, GaAsN, InGaAsP, InAlGaAs or InGaAsSbN may also serve as the absorber means 5.

To improve the mode selection, relief structures 30 (for example in the form of Fresnel lenses 30) can also be used in the mirror layers. Modulation dopings may also contribute to improving the mode selection.

The introduction of spacer layers 20, in particular between the active zone 4 and the absorber means 5, improves the mode selection.

In the embodiment described here, only one absorber means is used in the vertical resonator. It is also possible in principle, in alternative embodiments, to use the principle of transverse mode selection for integrating a plurality of bleaching or saturable absorber means. This is appropriate in the case in which, for example, a plurality of active layers are provided in a stack of layers, as occurs in the case of a multistage vertically emitting laser diode (cascaded laser diode). In cascaded laser diodes, the active regions are electrically coupled with one another by tunnel diodes operated in the reverse direction, thereby achieving a higher optical gain in the vertical resonator.

The increased optical gain in the vertical resonator leads to an improved mode selection in the integrated absorber media.

In any event (i.e. in the case of one or more absorber means 5), the optical bleaching by decoloring of the absorber can be additionally assisted by local current constriction.

P-doped, n-doped or undoped layers may be used as layers of the absorber means 5. A combination of doped (for example pn, pin) layers may also be used. The absorber medium may be integrated at any desired points in the laser structure (for example into one of the tunnel diodes).

The invention is not restricted in its implementation to the preferred exemplary embodiments specified above. Rather, a number of variants which also make use of the laser diode according to the invention in fundamentally different configurations are conceivable.

LIST OF DESIGNATIONS

1 n-doped GaAs substrate
2 first Bragg reflector
3 carrier capture layer
4 active zone
4a $In_{0.8}Ga_{0.2}As$ quantum films
4b GaAs barrier
4c GaAs boundary layer
5 decoloring absorber means
6 second Bragg reflector
7 GaAs contact layer
10 GeNiAu contact
20 TiPtAu contact
50 decoloring absorber layer
51 carrier capture layer
52 cladding layer
53 current constriction means (AlAs layer)
54 layer for increasing reflectivity
100 standing wave field

We claim:

1. A laser diode emitting a beam having a profile, comprising:
   a vertical resonator; and
   a laser diode beam profile shaper having at least one bleaching absorber in said vertical resonator, said at least one bleaching absorber formed as a layer in said vertical resonator, said layer having a thickness approximately equal to a quarter of a material wavelength.

2. The laser diode according to claim 1, including at least one pn junction having a material selected from the group consisting of III-V compound semiconductor material and II-VI compound semiconductor material.

3. The laser diode according to claim 1, wherein said at least one absorber is monolithically integrated into a series of layers.

4. The laser diode according to claim 3, wherein:
   said series of layers has a Fabry-Perot resonator; and
   said at least one absorber is disposed in said Fabry-Perot resonator.

5. The laser diode according to claim 2, wherein:
   said pn junction has a depletion zone; and
   said at least one absorber is disposed outside said depletion zone.

6. A laser diode emitting a beam having a profile, comprising:
   a vertical resonator; and
   a laser diode beam profile shaper having at least one bleaching absorber in said vertical resonator, said at least one bleaching absorber formed as a layer having a thickness greater than a quarter of a material wavelength.

7. The laser diode according to claim 6, wherein said layer is formed in said vertical resonator.

8. The laser diode according to claim 1, wherein said at least one absorber has a current constrictor.

9. The laser diode according to claim 8, wherein said current constrictor is a combination of a medium of said absorber with one of the group consisting of an oxide aperture and proton implantation.

10. The laser diode according to claim 1, wherein said at least one absorber has a means for current constriction.

11. The laser diode according to claim 10, wherein said current constricting means is a combination of a medium of said absorber with one of the group consisting of an oxide aperture and proton implantation.

12. The laser diode according to claim 2, wherein said pn junction has a p-contact and an n-contact each to be connected to a respective one of two electrical supply leads.

13. The laser diode according to claim 1, wherein said vertical resonator has a means for current constricting.

14. The laser diode according to claim 1, wherein said vertical resonator has a current constrictor.

15. The laser diode according to claim 1, wherein said vertical resonator has at least one spacer layer.

16. The laser diode according to claim 15, wherein:
    said vertical resonator has an absorber layer and an active zone; and
    said at least one spacer layer is disposed between said absorber layer and said active zone.

17. The laser diode according to claim 16, wherein at least one layer of said vertical resonator is of one of the group consisting of GaAsN and InGaSbP.

18. The laser diode according to claim 14, wherein:
    said vertical resonator has layers; and
    at least one of said layers of said vertical resonator is of one of the group consisting of GaAsN and InGaSbP.

19. A laser diode emitting a beam having a profile, comprising:
    a vertical resonator;
    a means for shaping the beam profile connected to said vertical resonator; and
    said shaping means having at least one absorber means for bleaching by decoloring in said vertical resonator, said at least one absorber means formed as a layer in said vertical resonator, said layer having a thickness approximately equal to a quarter of a material wavelength.

20. An optical system, comprising:
    a laser diode emitting a beam having a profile, the laser diode including:
        a vertical resonator; and
        a laser diode beam profile shaper having at least one absorber layer for bleaching in said vertical resonator, said at least one absorber layer disposed in said vertical resonator, and said absorber layer having a thickness approximately equal to a quarter of a material wavelength.

21. A compact disc player, comprising:
    a laser diode emitting a beam having a profile, the laser diode including:
        a vertical resonator; and
        a laser diode beam profile shaper having at least one absorber configured to bleach by decoloring in said vertical resonator, said at least one absorber formed as a layer in said vertical resonator, said layer having a thickness approximately equal to a quarter of a material wavelength.

22. A data transmission system, comprising:
    a laser diode emitting a beam having a profile, the laser diode including:
        a vertical resonator; and
        a laser diode beam profile shaper having at least one absorber for bleaching by decoloring in said vertical resonator, said at least one absorber formed as a layer in said vertical resonator, said layer having a thickness approximately equal to a quarter of a material wavelength.

* * * * *